United States Patent
Waffenschmidt et al.

(10) Patent No.: US 9,210,762 B2
(45) Date of Patent: Dec. 8, 2015

(54) ELECTROLUMINESCENT DEVICE

(75) Inventors: Eberhard Waffenschmidt, Eindhoven (DE); Adrianus Sempel, Eindhoven (NL); Dave Willem Van Goor, Eindhoven (NL); Henricus Theodorus Van Der Zanden, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 186 days.

(21) Appl. No.: 14/002,844

(22) PCT Filed: Feb. 27, 2012

(86) PCT No.: PCT/IB2012/050882
§ 371 (c)(1),
(2), (4) Date: Sep. 3, 2013

(87) PCT Pub. No.: WO2012/120404
PCT Pub. Date: Sep. 13, 2012

(65) Prior Publication Data
US 2013/0334960 A1    Dec. 19, 2013

(30) Foreign Application Priority Data
Mar. 7, 2011 (EP) .................................... 11305237

(51) Int. Cl.
*H05B 33/08* (2006.01)
*H01L 27/32* (2006.01)
*H01L 51/52* (2006.01)

(52) U.S. Cl.
CPC ........ *H05B 33/0896* (2013.01); *H01L 27/3202* (2013.01); *H01L 51/52* (2013.01); *H05B 33/08* (2013.01); *H01L 2251/564* (2013.01)

(58) Field of Classification Search
CPC .... H05B 33/0896; H05B 33/08; H01L 51/52; H01L 27/3202; H01L 2251/564
See application file for complete search history.

(56) References Cited

U.S. PATENT DOCUMENTS

| | | | |
|---|---|---|---|
| 5,559,402 A * | 9/1996 | Corrigan, III | 315/169.3 |
| 2004/0012336 A1 | 1/2004 | Okuda | |
| 2013/0234600 A1* | 9/2013 | Park | 315/122 |
| 2014/0197695 A1* | 7/2014 | Waffenschmidt et al. | 307/104 |
| 2014/0321183 A1* | 10/2014 | Merlo | 363/134 |

FOREIGN PATENT DOCUMENTS

| | | |
|---|---|---|
| JP | 2003059649 | 2/2003 |
| WO | WO2009153715 A2 | 12/2009 |

* cited by examiner

*Primary Examiner* — Jung Kim
(74) *Attorney, Agent, or Firm* — Larry Liberchuk

(57) ABSTRACT

The present invention relates to an electroluminescent device (100) comprising a pair of electroluminescent stacks (101, 102), each stack comprising a first electrode layer (103,104), a second electrode layer (105,106) and an electroluminescent layer (107,108) being located between the first and second electrode layers (103-105,104-106), an electrical connection (115,116) between the two stacks (101,102),each of the second electrode layers comprising a conductive plate, the two conductive plates forming a pair of receiver electrodes for capacitive power transfer.

9 Claims, 5 Drawing Sheets

ELECTROLUMINESCENT DEVICE

The present invention relates to the field of electroluminescent devices and, more particularly, to organic light emitting diode (OLED) devices.

Electroluminescent devices comprise electroluminescent material that is capable of emitting light when a current is passed through it. The material used for electroluminescent devices can be light emitting polymers or small organic molecules. Organic devices may, for example be organic light emitting diodes (OLEDs), which are known in the art. For activating the electroluminescent devices, current is applied to the electroluminescent material by means of electrodes.

Electroluminescent devices, such as OLEDs, comprise electroluminescent material disposed between electrodes. Upon application of a suitable voltage, current flows through the electroluminescent material from anode to cathode. Light is produced by radiative recombination of holes and electrons inside the electroluminescent material.

The present invention aims at providing an electroluminescent device with a capacitive wireless power supply. To this end, the electroluminescent device in accordance with the invention comprises a pair of electroluminescent stacks. Each stack comprises a first electrode layer, a second electrode layer and an electroluminescent layer being located between the two electrode layers. The electroluminescent device also comprises an electrical connection between the two stacks. And each of the second electrode layers comprises a conductive plate, the two conductive plates forming a pair of receiver electrodes for capacitive power transfer.

The invention makes possible the use of an electroluminescent device with a capacitive wireless power supply thanks to use of a pair of electroluminescent stacks electrically connected to each other, the second electrode layers of the stacks being used as capacitive power receivers. The electroluminescent layer of a stack is located between the first and second electrode layers. According to embodiments of the invention, the electroluminescent device comprises a first insulating substrate, the pair of electroluminescent stacks being located on the first substrate. The second electrode layers may be located on the first insulating substrate.

According to embodiments of the invention, the first insulating substrate may be is glass, plastic or foil.

According to embodiments of the invention, the electroluminescent device may further comprise a second substrate covering the pair of stacks.

According to embodiments of the invention, the electroluminescent device may comprise an insulating housing comprising at least first and second insulating substrates.

According to embodiments of the invention, the electrical connection may consist of an electrical connection between the first electrode layers and the second electrode layers.

According to embodiments of the invention an alternative current voltage is transferred into the electrode layers by the capacitive coupling. The transferred voltage is applied to the electroluminescent layer being located between the two electrode layers. Thus, the first and the second electrode layer are adapted for applying a voltage on the electroluminescent layer. Because the electroluminescent device acts as a diode and blocks the current in reverse direction, only during one of the half-waves a current flows. Thus, the AC frequency has to be high enough to avoid flickering, e.g. larger than 100 Hz. It is to be noted that the frequency may equal the resonance frequency of the equivalent electrical circuit.

According to embodiments of the invention the electroluminescent layer is an organic light emitting diode (OLED).

According to embodiments of the invention the interconnection comprises a component for changing the resonance frequency. The resonance frequency is a frequency for which the power transfer of the capacitive power transfer is at its highest value. By adapting the resonance frequency for example interferences can be minimized. Thus, by applying a component for changing the resonance frequency the degree of power transfer can be optimized. The component can for example be an inductor element.

At least one side of the electroluminescent layer is transparent. For some applications, it may not be necessary to have the whole device transparent. In this case, one side may be non-transparent. The electrodes on this side may also be non-transparent.

In another aspect the invention relates to an illuminating apparatus comprising a plurality of embodiments of electroluminescent devices.

In another aspect the invention relates to a system comprising said electroluminescent device and a capacitive power transmitter. The capacitive power transmitter comprises a power source for generating an alternative current AC signal and two conductive plates electrically connected to the power source. The second electrodes of the electroluminescent device and the conductive plates are adapted to face to each other so as to form a capacitive coupling for capacitive power transfer. Then the capacitive power transmitter provides a wireless power supply to the electroluminescent device.

The system can for example be used to illuminate a window or any other surface. In a window the electroluminescent device is preferably transparent. Therefore, the electrodes have to be made of a transparent material, for example indium tin oxide ITO. When the electroluminescent device is supplied with capacitive wireless power, the electroluminescent layer emits light. The capacitive transmitter electrodes can for example be located in the window frame or in any other place, where it does not appear to the user's eye.

The present invention will now be described in more detail, by way of examples, with reference to the accompanying drawings, wherein FIG. 1 shows a schematic view of capacitive transmitter and receiver for wireless power transfer via capacitive coupling;

Figure 1:
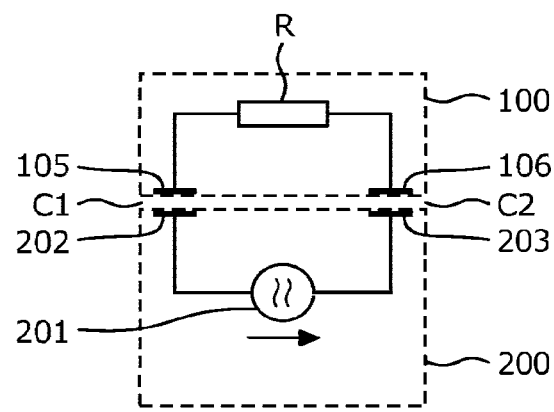
FIG. 1 shows a schematic view of a capacitive power transmission system. Capacitive wireless power transmission requires a capacitive transmitter and a capacitive receiver.

The capacitive transmitter, depicted under the reference 200, comprises a power source 201 and two transmitter electrodes 202 and 203. The power source 201 comprises a voltage generator. The two transmitter electrodes 202 and 203 are electrically connected to the power source 201.

The capacitive receiver, depicted under the reference 100, comprises a load R, and two receiver electrodes 105 and 106 electrically connected to the load R. When the receiver electrodes 105 and 106 are placed very close to the transmitter electrodes 202 and 203 so that they face to each other without electrical contact, they form two equivalent capacitors C1 and C2, respectively. Then, an appropriate alternative current AC can be generated by the power source 201 to power the load R in the capacitive receiver 100.

Figure 2:
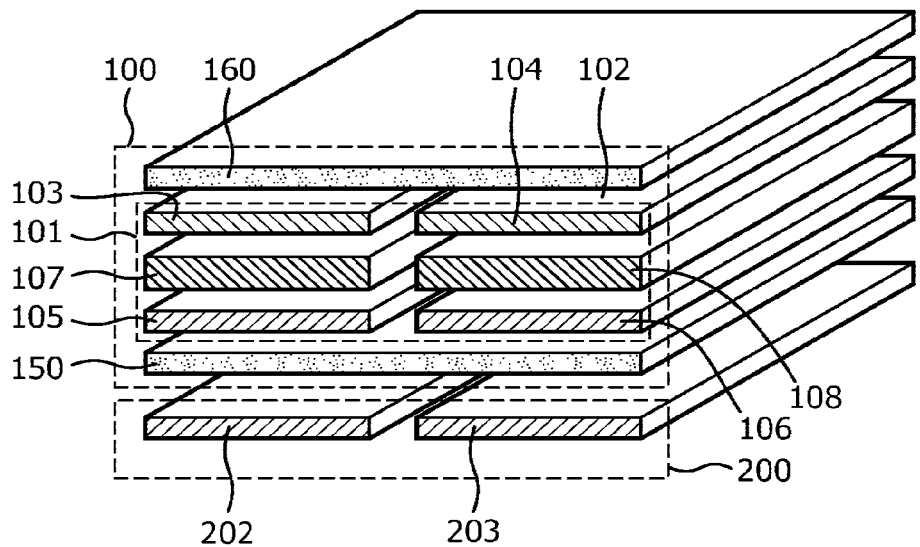
FIG. 2 shows a schematic view of an electroluminescent device with two electrodes.

FIG. 2 shows a structural schematic electroluminescent device 100 according to the invention. The electroluminescent device 100 plays the role of a capacitive receiver. The electroluminescent device 100 comprises a pair of electroluminescent stacks 101 and 102. The first stack 101 comprises a first electrode layer 103, a second electrode layer 105 and an electroluminescent layer 107 being located between the first electrode layer 103 and the second electrode layer 105. In the same way, the second stack 102 comprises a first electrode layer 104, a second electrode layer 106 and an electroluminescent layer 108 being located between the first electrode layer 104 and the second electrode layer 106. The electroluminescent layers are, for example, made of organic light emitting diode OLEDs.

Each of the second electrode layers 105 and 106 comprise an electrically conducting plate. The two conductive plates form a pair of receiver electrodes for capacitive power transfer.

One side of the plate receives the electroluminescent layer, whereas the other side is intended to face transmitter electrode 202 or 203 of a capacitive transmitter 200 also shown schematically on FIG. 2. The electroluminescent device 100 also comprises an electrical connection between the two stacks 101 and 102. The electrical connection will be described in more detail hereafter.

According to one embodiment, the material of the first electrode layers 103,104 and the second electrode layers 105, 106 may be carbon, aluminium, organic material like poly(3, 4-ethylenedioxythiophene) PEDOT, copper, silver. A transparent conductor material may also be used, e.g. indium tin oxide ITO.

According to one embodiment of the invention, the electroluminescent device 100 comprises a first insulating substrate 150, for example a thin glass plate, which thickness may be between 100 μm and 1 cm. The first insulating substrate 150 receives the pair of electroluminescent stacks 101, 102. More particularly, the second electrode layers 105, 106 of the pair of stacks 101,102 are located on the first insulating substrate 150. According to one example of a manufacturing process, a thin conducting layer of the second electrodes 105, 106 is deposited on the glass plate 150. Then several active organic layers are the formed on top of it as the active part of the OLED. And then the active part of the OLED is covered with a conducting layer of the first electrodes 101,102. The material of the first insulating substrate 150 may be glass, plastic or foil.

When the electroluminescent device 100 is placed on the transmitter electrodes 202, 203, two equivalent capacitances are configured: the first capacitance C1 comprises the second electrode 105, the first insulating substrate 150 and the transmitter electrode 202. The second capacitance C2 comprises the second electrode 106, the first insulating substrate 150 and the transmitter electrode 203. The electroluminescent device 100 may have a planar contactless interface for capacitive power transmission, with the second electrodes 105, 106 arranged in a coplanar way.

According to one embodiment of the invention, the electroluminescent device 100 comprises a second insulating substrate 160. The second insulating substrate 160 is located at the opposite of the first insulating substrate 150, and is intended to cover the first electrodes 103,104 of the pair of stacks 101 and 102. The material of the second insulating substrate 160 may be glass, plastic or foil.

Figure 3:
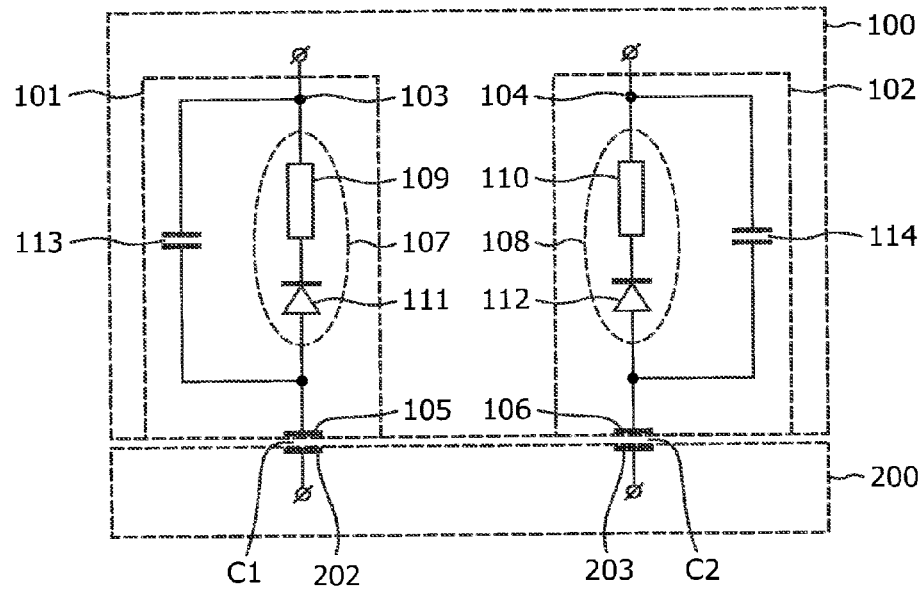
FIG. 3 shows a schematic view of an equivalent electrical circuit of an electroluminescent device of FIG. 2.

According to one embodiment of the invention, the electroluminescent device 100 may comprise an insulating housing (not shown). The insulating housing comprises at least the first insulating substrate 150 and the second insulating substrate 160, and provides an electroluminescent device 100 which is hermetically sealed. FIG. 3 shows an equivalent electrical circuit of the electroluminescent device 100 of FIG. 2. As in the case of the previous Figure, the same reference numerals are used for similar components which are represented in FIG. 3. In FIG. 3, the electroluminescent layer 107 comprises a resistor element 109 and a diode 111. The resistor element 109 represents the light emission function and the diode 111 represents the diode function of an organic light emitting diode (OLED). The capacitor element 113 in parallel to the resistor element 109 and the diode 111 is considered as a parasitic capacitor. The point 103 represents the first electrode of the electroluminescent stack 101.

The resistor element 109, the diode 111 and optionally the parasitic capacitor element 113 form an OLED structure which is in series with the capacitor C1. The capacitor C1 represents the power transmission capacitor of the capacitive wireless power transfer. One electrode of this capacitor C1 is the second electrode 105 of the electroluminescent stack 101. The other electrode of the capacitor C1 is one of the transmitter electrodes 202, 203. In the embodiment of FIG. 2, the first insulating substrate 150 is placed between the second electrode 105 and the transmitter electrode 202. In FIG. 3, the electroluminescent layer 108 comprises a resistor element 110 and a diode 112. The resistor element 110 represents the light emission function and the diode 112 represents the diode function of an organic light emitting diode (OLED). The capacitor element 114 in parallel to the resistor element 110 and the diode 112 is considered as a parasitic capacitor. The point 104 represents the first electrode of the electroluminescent stack 102.

The resistor element 110, the diode 112 and optionally the parasitic capacitor element 114 forms an OLED structure which is in series with the capacitor C2. The capacitor C2 represents the power transmission capacitor of the capacitive wireless power transfer. One electrode of this capacitor C2 is the second electrode 106 of the electroluminescent stack 102. The other electrode of the capacitor C2 is one the transmitter electrodes 202, 203. In the embodiment of FIG. 2, the first insulating substrate 150 is placed between the second electrode 106 and the transmitter electrode 203.

Figure 4:
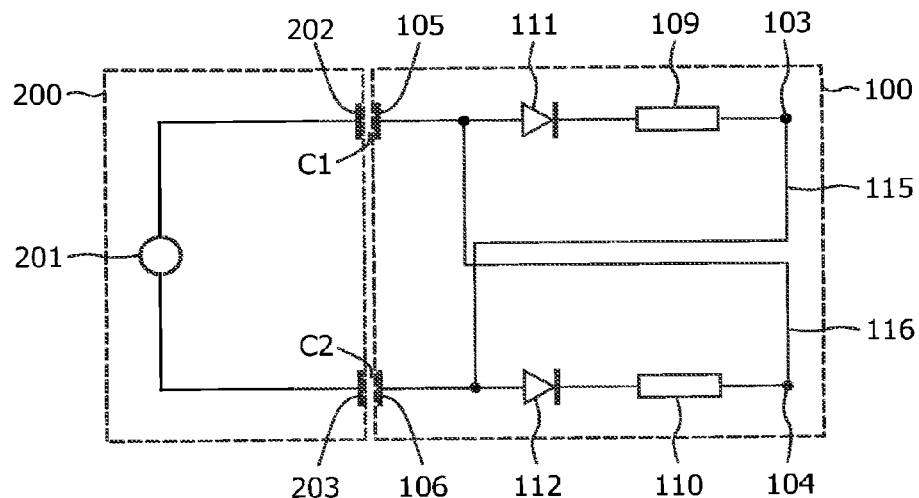
FIG. 4 shows a schematic view of an equivalent electrical circuit of capacitive transmitter and receiver according to a first embodiment.

FIG. 4 shows a schematic electrical circuit of a first capacitive wireless power system with a rotation of 90 degrees clockwise compared to the previous figures. In this figure, the parasitic capacitances 113 and 114 are neglected, for example when using low operating frequencies. Low operating frequencies mean a frequency which is lower than the cut-off frequency of the parasitic capacitor. FIG. 4 depicts one embodiment of the above-mentioned electrical connection between the two stacks 101 and 102 of FIG. 2. The electrical connection happens between the electrodes of the stacks. A first electrical connection 115 is made between the first electrode 103 of one stack 101 and the second electrode 106 of the other stack 102. A second electrical connection 116 is made between the first electrode 104 of the other stack 102 and the second electrode 105 of the one stack 101.

Figure 5:
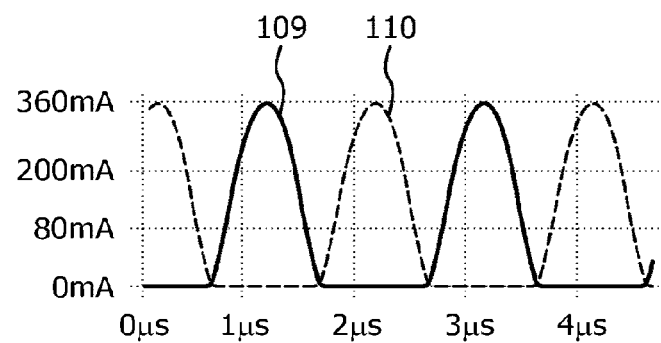
FIG. 5 shows a diagram of the current of the resistor element of an electroluminescent device according to the first embodiment of FIG. 4.
Figure 6:
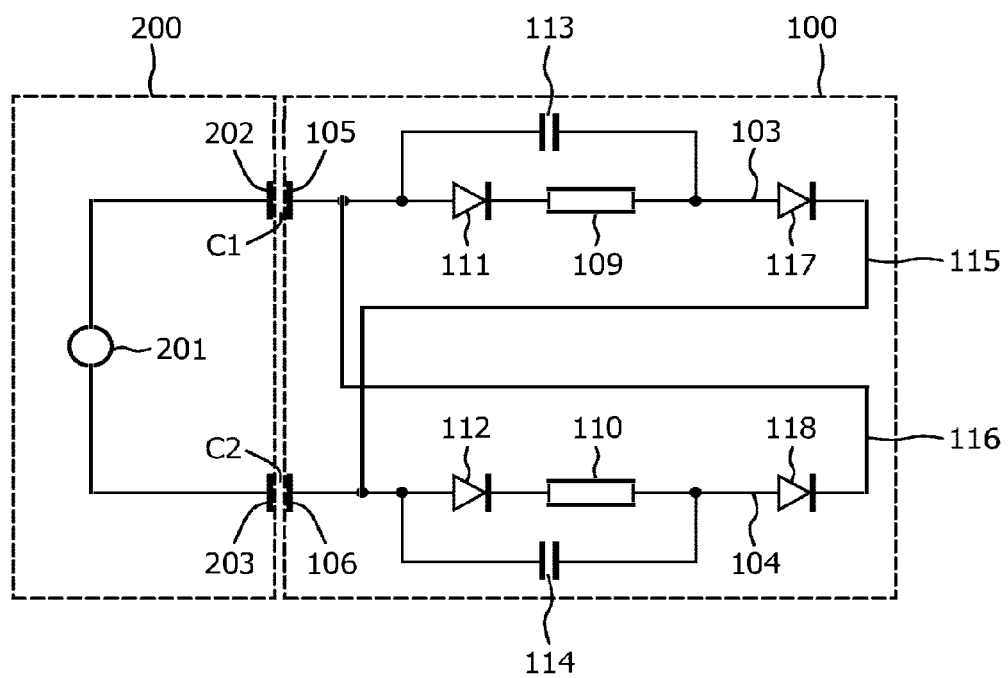
FIG. 6 shows a schematic view of an equivalent electrical circuit of capacitive transmitter and receiver according to a second embodiment.
Figure 7:
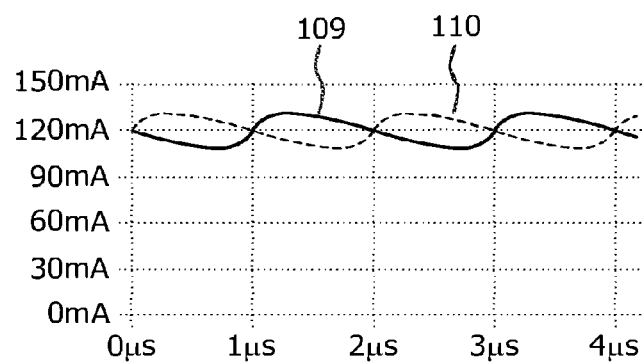
FIG. 7 shows a diagram of the current of the resistor element of an OLED device according to the second embodiment of FIG. 6.

FIG. 5 shows the current flowing in the resistor elements of FIG. 4. The reference number of the current curve corresponds to the reference number of the resistor element in FIG. 4. Only during one of the halve-waves a current may flow, because the diode blocks the current in reverse direction. FIG. 6 shows a schematic electrical circuit of a first capacitive wireless power system in which the electroluminescent device 100 further comprises the parasitic capacitances 113 and 114. The electroluminescent device 100 also comprises additional diodes to take into account the parasitic capacitance. Because the diode 111 (or 112) formed by the OLED may be shunted by the parasitic capacitor 113 (or 114) related to the OLED, one cannot rely on this diode 111 (or 112) when used with AC voltage. This embodiment improves the current flowing through the OLED (diode 111 and resistor 109, or diode 112 and resistor 110) instead of the parasitic capacitance 113 (or 114). The additional diodes 117 and 118 are used to rectify the AC voltage. The first additional diode 117 is placed preferably in the first electrical connection 115 between the first electrode 103 and the second electrode 106. The second additional diode 118 is placed preferably in the second electrical connection 116 between the first electrode 104 and the second electrode 105. The corresponding current curves in the resistor elements 109 and 110 are shown in FIG. 7 with the relevant reference number. The current curves show that the parasitic capacitances 113 and 114 smooth the current signal in the resistor elements and induce fewer ripples.

According to other embodiments of the invention, the electroluminescent device 100 may comprise a component for changing the resonance frequency of the device 100.

Figure 8:
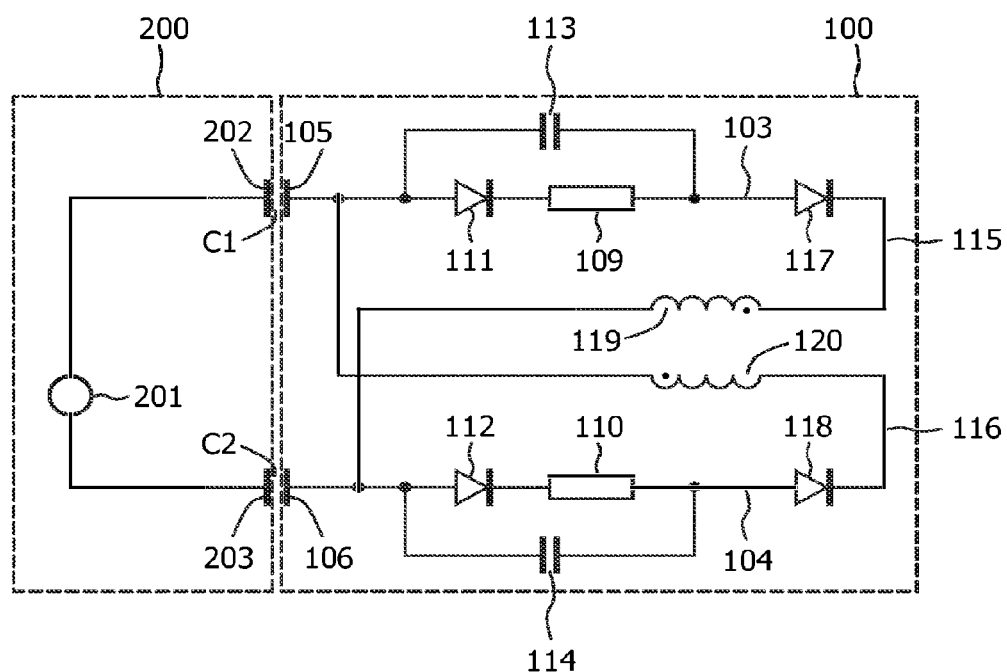
FIG. 8 shows a schematic view of an equivalent electrical circuit of capacitive transmitter and receiver according to a first example of a third embodiment.
Figure 9:
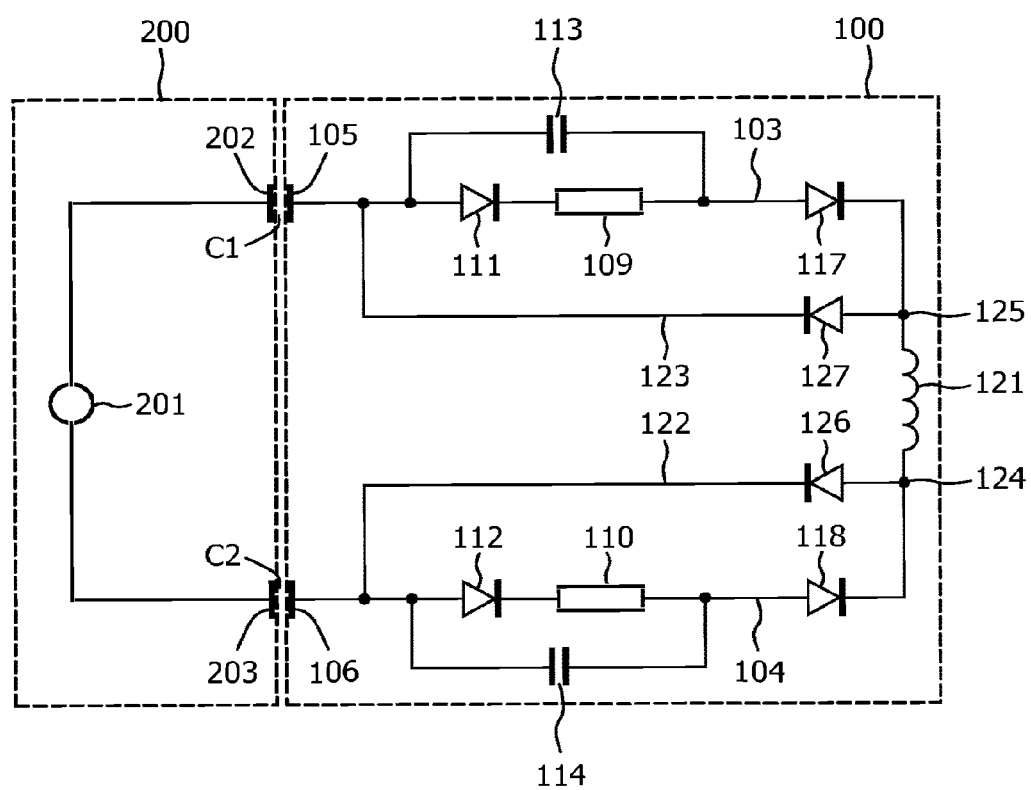
FIG. 9 shows a schematic view of an equivalent electrical circuit of capacitive transmitter and receiver according to a second example of the third embodiment.

Referring to FIGS. 8 and 9, the component for changing the resonance frequency of the device 100 is an inductor element. FIG. 8 shows schematically a first example in which an inductor element splits into a first winding 119 and a second winding 120. The first winding 119 is located in the first electrical connection 115 that is to say that the first winding 119 is connected between the first electrode 103 and the second electrode 106. The second winding 120 is located in the second electrical connection 116 that is to say that the second winding 120 is connected between the first electrode 104 and the second electrode 105. The first winding 119 and the second winding 120 are strongly coupled and the winding sense is opposite as indicated by the dots in FIG. 8. The value of the inductance is calculated so as to form a resonant RLC electrical circuit at a predetermined frequency. This has the advantage of increasing the power transfer of the capacitive wireless power system.

FIG. 9 shows schematically a second example. Here the inductor element consists of one winding 121. The inductor element 121 is electrically connected between the outputs 125 and 124 of the diodes 117 and 118, respectively. Additionally, a first electrical connection 123 is made between the point 125 and the second electrode 105. The first electrical connection 123 comprises a diode 127. In a symmetric way, a second electrical connection 122 is made between the point 124 and the second electrode 106. The second electrical connection 122 comprises a diode 126. This second example is easy to manufacture and may allow for smaller size of electroluminescent device 100.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An electroluminescent device comprising:
a pair of electroluminescent stacks;
each of the pair of electroluminescent stacks comprising a first electrode layer, a second electrode layer and an electroluminescent layer being located between the first and second electrode layers; and
an electrical connection between the pair of electroluminescent stacks;
wherein each of the second electrode layers comprises a conductive plate, the two conductive plates forming a pair of receiver electrodes for capacitive power transfer, and wherein the electrical connection between the pair of electroluminescent stacks comprises a component for changing a resonance frequency of the device, such that a degree of power transfer is optimized.

2. The electroluminescent device of claim 1, further comprising a first insulating substrate, the pair of electroluminescent stacks being located on the first insulating substrate.

3. The electroluminescent device of claim 2, wherein the second electrode layers are located between the first insulating substrate and the electroluminescent layers.

4. The electroluminescent device of claim 2, wherein the first insulating substrate is any one of glass, plastic, and foil.

5. The electroluminescent device of claim 2, further comprising a second insulating substrate covering the pair of stacks.

6. The electroluminescent device of claim 5, further comprising an insulating housing encapsulating the pair of electroluminescent stacks and comprising at least the first and second insulating substrates.

7. The electroluminescent device of claim 1, wherein the electrical connection includes an electrical connection between the first electrode layers and the second electrode layers.

8. The electroluminescent device of claim 1, wherein the electroluminescent layer is an organic light emitting diode.

9. A system, comprising:
an electroluminescent device comprising
a pair of electroluminescent stacks;
each of the pair of electroluminescent stacks comprising a first electrode layer, a second electrode layer and an electroluminescent layer being located between the first and second electrode layers; and
an electrical connection between the pair of electroluminescent stacks, wherein each of the second electrode layers comprises a conductive plate, the two conductive plates forming a pair of receiver electrodes for capacitive power transfer, and wherein the electrical connection between the pair of electroluminescent stacks comprises a component for changing a resonance frequency of the device, such that a degree of power transfer is optimized; and a capacitive power transmitter, wherein the transmitter comprises a power source for generating an alternative current signal and two conductive plates electrically connected to the power source, and wherein the second electrodes of the electroluminescent device and the conductive plates are configured to face each other so as to form a capacitive coupling for capacitive power transfer.

* * * * *